United States Patent
Franz et al.

(10) Patent No.: US 10,512,195 B2
(45) Date of Patent: Dec. 17, 2019

(54) SERVER DEVICE WITH CAPACITIVE CIRCUIT

(71) Applicant: HEWLETT PACKARD ENTERPRISE DEVELOPMENT LP, Houston, TX (US)

(72) Inventors: John P Franz, Houston, TX (US); Tahir Cader, Liberty Lake, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 35 days.

(21) Appl. No.: 15/522,634

(22) PCT Filed: Oct. 31, 2014

(86) PCT No.: PCT/US2014/063542
§ 371 (c)(1),
(2) Date: Apr. 27, 2017

(87) PCT Pub. No.: WO2016/069018
PCT Pub. Date: May 6, 2016

(65) Prior Publication Data
US 2017/0318706 A1   Nov. 2, 2017

(51) Int. Cl.
*H05K 7/20* (2006.01)
*H05K 1/14* (2006.01)
*H05K 7/14* (2006.01)

(52) U.S. Cl.
CPC ......... *H05K 7/20781* (2013.01); *H05K 1/147* (2013.01); *H05K 7/1487* (2013.01); *H05K 7/1498* (2013.01); *H05K 7/20763* (2013.01)

(58) Field of Classification Search
None
See application file for complete search history.

(56) References Cited

U.S. PATENT DOCUMENTS 5,145,323 A * 9/1992 Farr ...................... F04B 49/025
                                                                  417/18
6,826,948 B1   12/2004 Bhatti
(Continued)

FOREIGN PATENT DOCUMENTS

CN         1464357 A     12/2003
CN       203103913        7/2013
(Continued)

OTHER PUBLICATIONS

"Leak Detector System," Retrieved from Internet Oct. 14, 2014, <http://www.deeter.co.uk/products/leak-detector-system>.
(Continued)

*Primary Examiner* — Courtney L Smith
(74) *Attorney, Agent, or Firm* — Brooks, Cameron & Huebsch, PLLC

(57) ABSTRACT

Example implementations relate to a server device with a capacitive circuit. For example, a server device with a capacitive circuit can include a capacitive circuit located on a printed circuit assembly (PCA) of the server device and a baseboard management controller unit (BMC) to provide a communication interface between the capacitive circuit and a computing device. A voltage can be applied across the capacitive circuit and a signal can be sent from the capacitive circuit to the computing device using the BMC in response to a change in voltage.

19 Claims, 6 Drawing Sheets

(56) References Cited

U.S. PATENT DOCUMENTS

| | | | |
|---|---|---|---|
| 8,410,946 B2 | 4/2013 | Ansari | |
| 9,622,376 B2* | 4/2017 | Mathew | H05K 7/20236 |
| 9,664,702 B2* | 5/2017 | Holmes | G01N 35/0092 |
| 9,952,240 B2* | 4/2018 | Holmes | G01N 35/026 |
| 2003/0197198 A1* | 10/2003 | Panella | H01L 23/49805 |
| | | | 257/200 |
| 2005/0092080 A1* | 5/2005 | Harazin | G01F 23/26 |
| | | | 73/290 R |
| 2007/0051166 A1 | 3/2007 | Baker | |
| 2009/0021270 A1* | 1/2009 | Bandholz | G01N 27/223 |
| | | | 324/690 |
| 2009/0306833 A1 | 12/2009 | Vinson et al. | |
| 2014/0251583 A1 | 9/2014 | Eriksen | |
| 2017/0077694 A1* | 3/2017 | Mikulak | H02H 5/083 |
| 2017/0295677 A1* | 10/2017 | Shelnutt | H05K 7/20836 |
| 2017/0331899 A1* | 11/2017 | Binder | H04L 67/12 |
| 2018/0106844 A1* | 4/2018 | Nagaraj | G01R 27/2605 |

FOREIGN PATENT DOCUMENTS

| | | |
|---|---|---|
| TW | I286387 | 9/2007 |
| TW | 200923377 A | 6/2009 |

OTHER PUBLICATIONS

"Water Leak Detection System" PAN Kinetics, Retrieved from Internet on Oct. 14, 2014, <http://www.pan-kinetics.com/portfolio/water-leak-detection-system/ >.
PCT/ISA/KR, International Search Report, dated Jul. 23, 2015, 10 pages, PCT/US2014/063542.

\* cited by examiner

SERVER DEVICE WITH CAPACITIVE CIRCUIT

BACKGROUND

A server device, as used herein, can include a device (e.g., a computing device) that is a server and/or is associated with a server and/or server system. A server is a device that responds to requests across a network to provide and/or help provide a service. Server devices can have temperature limitations. For example, a server device can malfunction if the temperature of the server device reaches or exceeds a threshold temperature. Heat from the use of the server devices can be controlled using cooling systems. Examples of cooling systems include air and liquid cooling systems.

DETAILED DESCRIPTION

Figure 1:
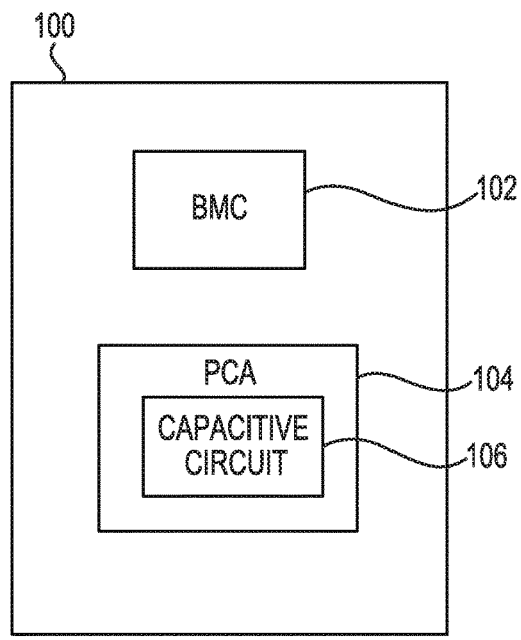
FIG. 1 illustrates a diagram of an example of a server device with a capacitive circuit according to the present disclosure.

Server devices and systems can be designed to balance conflicts between power density, spatial layout, temperature requirements, acoustic noise, and other factors. Air cooling systems can use heat sinks and fans to remove "waste" heat from the system. The use of heat sinks and fans increase the electrical power to operate the server device and/or system, and may cause excessive acoustic noise and lower system density. Liquid cooling can be more efficient than air cooling; however, the liquid cooling typically includes plumbing connections within the server devices. As the liquid goes through the plumbing connections the risk of leakage of the liquid within the server device is introduced.

Liquid leakage can cause damage to the server devices. For example, liquid leaked can cause a server device to malfunction and/or terminate. To reduce damage, a dielectric fluid can be used and/or the liquid may be near the circuit but not in contact. However, dielectric fluids are expensive compared to other liquids, are hazardous (e.g., safety issues in handling and limitation in how to dispose of the liquid), and the thermal performance is lower than other liquids, such as water. Further, having the liquid near but not in contact with the circuit can have a lower thermal performance than a liquid in contact with the circuit.

Alternatively, to reduce damage, the server devices and/or server systems can be monitored to detect leaks. However, monitoring complex server systems can be difficult. For instance, a user may identify a leak but not be able to quickly identify the source of the leak. The user may shut down a chassis or an entire rack to prevent further damage and/or to stop the leak.

Examples in accordance with the present disclosure can include a server device with a capacitive circuit. Example server devices can include a rack server, a blade server, a server cartridge, loads on a server device, a chassis, and/or a rack, among other devices. The capacitive circuit can be in communication with a management system of the server device. A voltage can be applied to the capacitive circuit and a change in voltage can be communicated to the management system. A change in voltage can occur in response to the presence of liquid. The management system can communicate the change of voltage and a unique identification (ID) of the server device to a computing device, such as a chassis/host controller. The computing device can provide an alert to a user and/or shut-off liquid input to the server device in response to the communication.

In various examples, a capacitive circuit can be located on multiple levels of a server system, such as on the blade server/rack server, the chassis, and/or the rack to create redundant liquid detection in the server system. The redundancy in detection can reduce and/or prevent false positive alerts and can allow for a multiple actions in response to changes of voltage. False positive alerts can result in powering down a chassis and/or server rack to inspect the falsely identified leak. Powering down an entire chassis and/or server rack can cause network disruption, for example.

For example, an alert can be provided in response to a change in voltage at the server level (e.g., blade server, rack server, and/or individual loads). Further, liquid input to the server system can be automatically terminated in response to a change in voltage at the chassis level and/or rack level.

A number of examples can further contain and/or protect server devices from a leak that is occurring. For example, a tub structure can be located beneath and/or surround a server device to collect liquid from a leak. Further, the server device can be covered in a conformal coating to reduce damage to the server device in the event of a leak.

The combined leak detection, containment, and protection can reduce damage to server devices in a server system. A location of a leak detected can be identified using the capacitive circuit in communication with the management system. A user alerted to a potential leak can be given the necessary information to locate and inspect the potential leak. Further, in particular instances, liquid input to the server system can be shut-off automatically. If a leak is occurring, the tub structures can reduce the liquid flow to other locations in the server system. And, the conformal coating can reduce damage to a server device that is experiencing the leak.

As used herein, a server device can refer to a rack server, a blade server, a server cartridge, a chassis, a rack, and/or individual loads. A rack server can include a computer that is used as a server and designed to be installed in a rack. A blade server can include a thin, modular electronic circuit board that is housed in a chassis and each blade is a server. A server cartridge, as used herein, can include a frame (e.g., a case) substantially surrounding a processor, a memory, and a non-volatile storage device coupled to the processor.

A chassis can include an enclosure which can contain multiple blade servers and provide services such as power, cooling, networking, and various interconnects and management. A rack can include a frame (e.g., metal) that can contain a plurality of servers and/or chassis stacked one above one another.

A load can include cache memory, dual inline memory modules (DIMMs), Non-Volatile Dual In-Line Memory Modules (NVDIMMs), and/or array control logic, among other storage controllers and/or devices associated with the server devices.

FIG. 1 illustrates a diagram of an example of a server device 100 with a capacitive circuit 106 according to the present disclosure.

As Illustrated by FIG. 1, a server device 100 can include a capacitive circuit 106 located on a printed circuit assembly (PCA) of the server device 100. A PCA, as used herein, is a printed circuit board populated with electronic components (e.g., a processor, a memory, etc.). A capacitive circuit located on a PCA can be on the top and/or bottom, above or below a PCA of the server device 100 and is integrated directly onto the PCA. The PCA can be a motherboard of the server device 100. That is, the capacitive circuit 106 is integrated directly onto (e.g., embedded within) the motherboard of the server device 100 (physically and electrically).

A capacitive circuit, as used herein, is a circuit with a capacitor in the circuit. A capacitor can include a passive two-terminal electrical component used to store energy electrostatically in an electric field. For example, the capacitive circuit can include an integrated network of traces on the PCA 104 of the server device 100. A voltage can be applied across the capacitive circuit 106 (e.g., by a battery and/or other power source of the server device 100). The voltage applied across the capacitor in the capacitive circuit 106 can be proportional to the charge that is stored in the capacitor.

For example, the capacitive circuit 106 can have a constant voltage applied across. In the presence of liquid, the voltage across the capacitor can change.

The server device 100 can include a management system. For example, the management system can include a baseboard management controller unit (BMC) 102 to provide a communication interface between the capacitive circuit 106 and a computing device. The computing device can include a chassis/host controller, among other devices, as discussed further herein.

The BMC 102 can be a specialized microcontroller embedded on the PCA 104 (e.g., the motherboard, in some examples) of the server device 100, and that manages the interface between system management software and platform hardware. While examples herein use BMC as examples of a management system, examples of the present disclosure are not so limited. Other types of management systems can be used to perform the various examples described in this disclosure. Furthermore, while specific examples are outlined herein, describing actions performed by a BMC, examples are not limited. Actions described as being performed by a BMC can be performed by other types of system firmware.

The BMC 102 can allow the server device 100 to communicate with a computing device, such a chassis/host controller. For example, a signal can be sent to the computing device using the BMC 102 in response to a change in voltage across the capacitive circuit 106. The voltage can change in response to a presence of liquid on the capacitive circuit 106. The signal can include an alert of the presence of liquid and a unique ID of the server device 100.

The unique ID can be used, for instance, to identify a location of a leak. For example, as discussed further herein, the computing device can identify a location of the server device 100 in a server system using the unique ID of the server device 100 in the signal.

In a number of examples, a plurality of server devices in a datacenter can each include a capacitive circuit. A datacenter, as used herein, can include a plurality of server devices (e.g., racks and/or chassis with rack servers, blade servers, and/or cartridge servers) in one or more rooms. For example, leaks can be detected at multiple levels of the datacenter. Levels of a datacenter can include a rack level, chassis level, server or blade level, and/or load level. As an example, capacitive circuits can be located on a rack, on a chassis installed in the rack, on a blade server or cartridge server installed in the chassis, and/or on a load located within the blade server or cartridge server. Further, capacitive circuits can be located on a rack, on a rack server, and/or on a load located within the rack server.

Each server device with capacitive circuit (at the multiple levels of the datacenter) can include a BMC and/or a leak detection device, as discussed further herein, to identify and report a leak. For instance, each capacitive circuit can connect to the motherboard of a server device. Depending on the particular server level, the BMC of the server device can be embedded on the motherboard and/or be connected to the motherboard. For example, a capacitive circuit located on a load can be connected to the motherboard of a rack server, blade server, and/or cartridge server. This can provide redundancy to the primary detection circuit found in the PCA and/or server device to reduce false positives and/or false negatives. Further, the unique ID can be used to identify the particular server device at a particular server level that may be experiencing a leak.

The capacitive circuit 106 can, in some examples, be located in a variety of locations depending on the orientation of the server device 100 and/or the type of server device 100. For example, a rack server and/or blade server can be installed (e.g., in a rack or chassis, respectively) horizontally and/or vertically. Depending on the orientation, it can be beneficial to locate the capacitive circuit 106 in different locations for detecting a leak.

For example, with a horizontally oriented server device, a capacitive circuit can be located at the top and/or bottom of the server device. Conversely, with a vertically oriented server device, a capacitive circuit can be located on either and/or both sides of the server device. Although the location of the capacitive circuit 106 in accordance with the present disclosure is not limited to the above provided examples and can be in a variety of locations.

Figure 3:
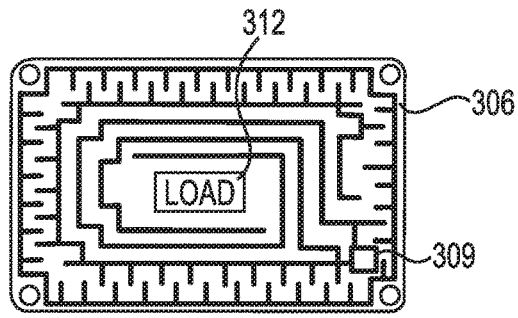
FIG. 3 illustrates an example of a capacitive circuit according to the present disclosure.

Further, the capacitive circuit 106, as illustrated by FIGS. 3 and 4, can include two electric circuits interleaved in a comb-like structure to form a leak detection pad. Alternatively, the capacitive circuit 106 can include a rope style circuit.

In some examples, the server device 100 can include a tub structure located under and/or surrounding the server device 100 to collect liquid. The tub structure can include a containment space to collect liquid and contain the liquid close to the source of the leak. The tub structure can include a drain, such that the liquid may not fill the tub structure and leak over. The containment of the liquid can reduce equipment damage in a server system (such as rack/datacenter).

In various examples, the server device 100 can include a coating to protect the server device 100 from liquid. The coating can include a protective material that is covering the server device 100. Example protective materials can include a conformal coating.

For example, in the event that a leak is not detected at the server level (e.g., rack server, blade server, or loads) due to insufficient coverage of the capacitive circuit 106, the leak may be detected at the chassis or rack level. The coating can protect the PCA 104 of the server device 100 to provide time for a user to be alerted of the leak, power off the server device 100 and/or other nearby server devices in a server system, and/or shut off liquid input to the server device 100.

Figure 2:
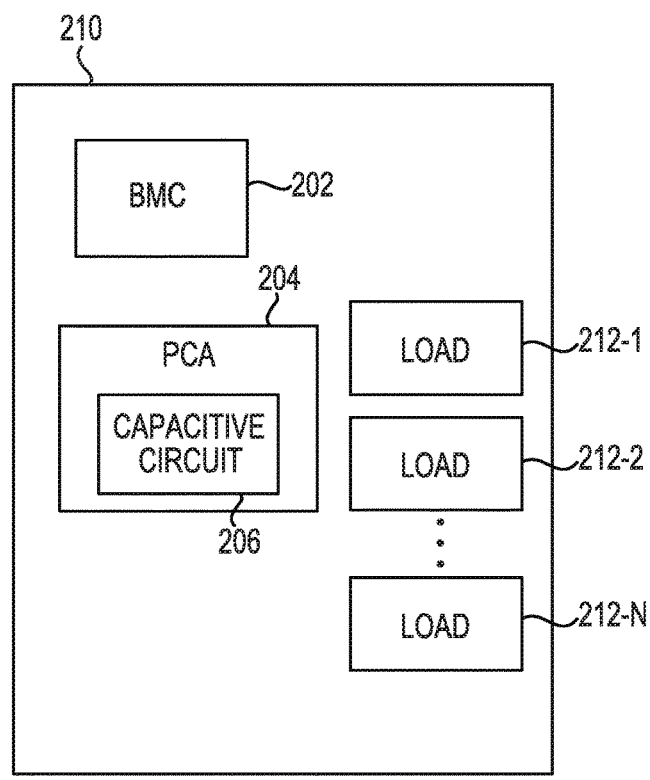
FIG. 2 illustrates a diagram of an example of a server device with a capacitive circuit according to the present disclosure.

FIG. 2 illustrates a diagram of an example of a server device 210 with a capacitive circuit 206 according to the present disclosure. The server device 210 illustrated by FIG. 2 can include the same and/or a different server device than the server device 100 illustrated by FIG. 1.

Similarly to FIG. 1, the server device 210 can include a capacitive circuit 206 located on a printed circuit assembly (PCA) 204 of the server device 210. That is, the capacitive circuit 26 is integrated directly onto the motherboard of the server device 200 (physically and electrically). Further, the server device 210 can include a BMC 202 to provide a communication interface between the capacitive circuit 206 and a computing device.

As illustrated by FIG. 2, in a number of examples, the server device 210 can include a plurality of loads 212-1, 212-2, . . . , 212-N. Loads, as previously discussed, can include cache memory, dual inline memory modules (DIMMs), Non-Volatile Dual In-Line Memory Modules (NVDIMMs), and/or array control logic, among other storage controllers and/or devices associated with the server device 210.

In response a change in voltage across the capacitive circuit 206, a signal can be sent from the capacitive circuit 106 to the computing device using the BMC 202. The signal can include an alert of the presence of liquid and a unique ID of the server device 210.

FIG. 3 illustrates an example of a capacitive circuit 306 according to the present disclosure.

For example, the capacitive circuit 306 is a printed circuit integrated into the PCA. A printed circuit integrated into the PCA can include two electronic circuits interleaved in a comb-like structure or two discontinuous traces creating an open circuit. With the two discontinuous traces, when liquid bridges across the two traces, the circuit is closed and can cause a signal to occur. The signal can include an alert of a leak.

The capacitive circuit 306 can be located around a load 312 of a server device. Example loads can include a memory bank, a central processing unit, a graphic processing unit, etc.

Further, the capacitive circuit 306 can include a leak detection logic device 309. A leak detection logic device can include logic to identify and report a leak. For example, leak detection logic device can include a BMC integrated with a PCA. When liquid covers any part of the capacitive circuit 306, the measured voltage can change due to the change in capacitive gap. The measured voltage change can indicate the presence of liquid.

Figure 4A:
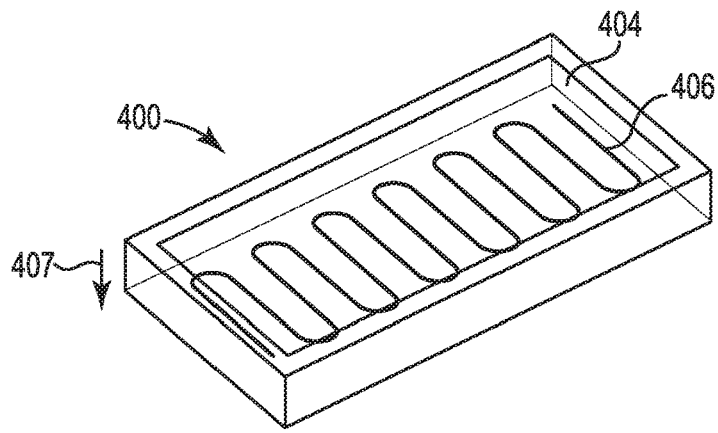
FIGS. 4A-4B illustrate examples of a capacitive circuit in a rope form according to the present disclosure.
Figure 4B:
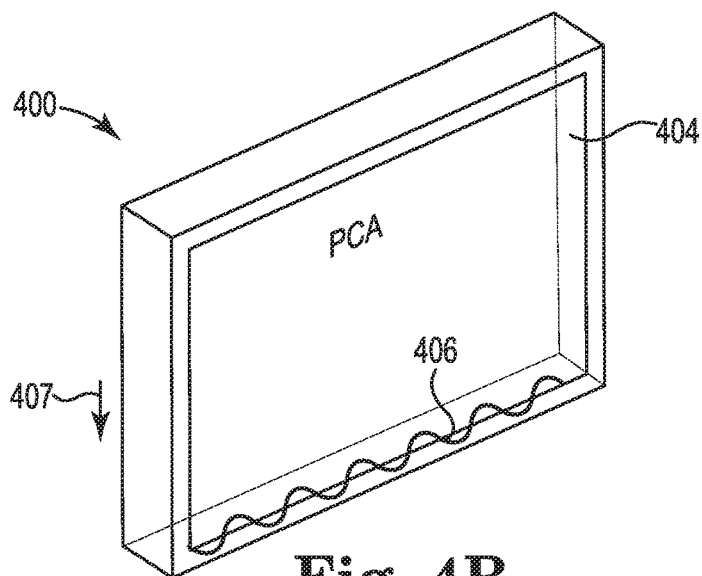

FIGS. 4A-4B illustrate examples of a capacitive circuit 406 in a rope form. For example, the capacitive circuit 406 in a rope form can include two electronic circuits interleaved in a rope-like structure.

The capacitive circuit 406 in a rope form can be located around the perimeter of a server sheet metal shell associated with a server device 400 and connected with the PCA 404 of the server device 400. The PCA 404 can include a BMC (not illustrated by FIGS. 4A-4B) to provide a communication interface between the capacitive circuit 406 and a computing device (e.g., chassis/host controller) to sense a leak and provide an alert in response to the leak. Alternatively, the capacitive circuit 406 in rope form can be held in a serpentine path under a PCA 404 of the server device 400 and/or in a tub structure that is beneath the server device 400, as further discussed herein.

For example, FIG. 4A illustrates a capacitive circuit 406 in a rope form that is held in a serpentine path under a PCA 404 of a server device 400 on the bottom of a server device 400 that can be installed in a horizontal orientation in a rack. The bottom of the server device 400 can include a top of the server device, as in some instances, a server device can be installed upside down.

For example, when a server device 400 is installed in a horizontal orientation in a rack, gravity can be directed toward the capacitive circuit 406, as illustrated by the arrow 407. That is, the arrow 407 can illustrate a direction of gravity. In the event of a liquid leak, liquid may travel towards the capacitive circuit 406 and can be detected. An alert can be sent to a computing device using a BMC on the PCA 404.

FIG. 4B illustrates a capacitive circuit 406 in a rope form that is held in a serpentine path under a PCA 404 of a server device 400 on the bottom (e.g., the side of the server device when oriented horizontally) of a server device 400 that can be installed in a vertical orientation in a rack. When a server device 400 is installed in a vertical orientation in a rack, gravity can be directed toward the capacitive circuit, as illustrated by the arrow 407. In the event of a liquid leak, liquid may travel towards the capacitive circuit 406 and can be detected. An alert can be sent to a computing device using a BMC on the PCA 404.

Figure 5:
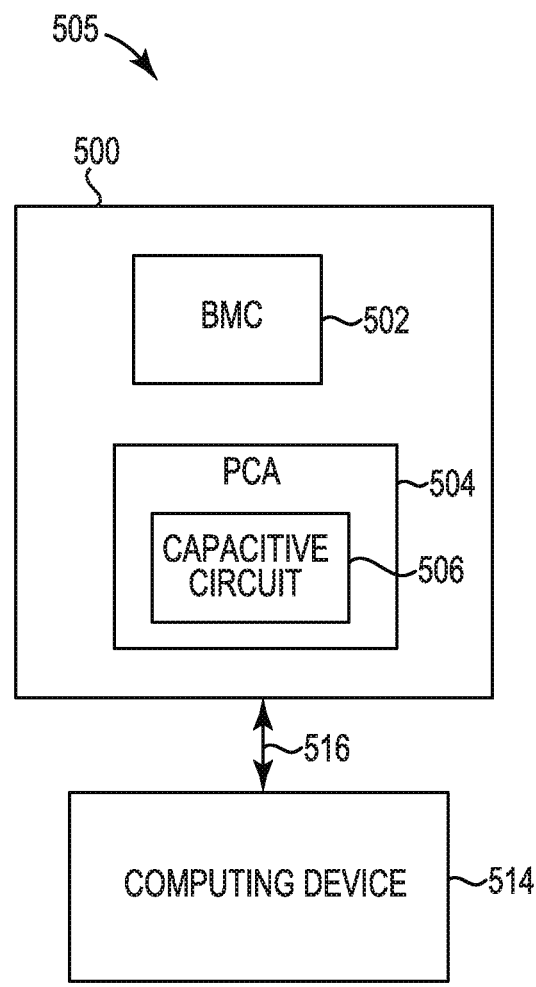
FIG. 5 illustrates a diagram of an example of a server system according to the present disclosure.

FIG. 5 illustrates a diagram of an example of a server system 505 according to the present disclosure.

The server system 505 can include a server device 500 and a computing device 514. As previously discussed, the server device 500 can include a capacitive circuit 506 on a PCA 504 of the server device 500 and a BMC 502. The BMC 502 can provide a communication interface between the capacitive circuit 506 and the computing device 514.

A voltage applied across the capacitive circuit 506 can be measured. In response to a change in voltage, a signal can be sent from the capacitive circuit 506 to the computing device 514 using the BMC 502.

The computing device 514 can receive the signal from the BMC 502 of the server device 500 indicating a detection of liquid. Further, the computing device 514 can identify a location of the server device 500 in the server system 505 using a unique ID of the server device 500 in the signal.

In various instances, the server system 505 can include a plurality of server devices, such as the server device 500. Such server systems can include datacenters with a plurality of racks and/or chassis in one or more rooms. Using a unique ID can assist in (quickly) locating the server device 500 with a potential leak to investigate the leak.

The computing device 514, in some examples, can include a chassis/host controller. The chassis/host controller can be separate from the chassis supporting a plurality of server devices and/or separate from the server device 500. A chassis/host controller can control management function for server devices. The management function can include the addition and/or removal of server device connections. That is, the chassis/host controller includes circuitry that can be used to control, add, remove, and/or register server devices with the chassis and/or rack server. The chassis/host controller can also control operation of the server device 500 such as the movement of data from volatile memory (e.g., cache) to persistent memory (e.g., to non-volatile memory (persistent DRAM, flash, etc.)).

The computing device 514 can be coupled to the server device 500 via a signal control line 516. The signal control line 516 can communicate signals between the BMC 502 and the computing device 515.

The server system 505, in various examples, can include a tub structure. For example, the server device 500 can include a blade server and the tub structure can be located under a chassis of the blade server to collect liquid. Alternatively, the server device 500 can include a rack server and the tub structure can be located under the rack server. In some example, the server device 500 can include a server cartridge and the tub structure can surround the server cartridge to collect liquid.

In a number of examples, the tub structure can include a capacitive circuit on a PCA of the tub structure. The PCA can, for instance, be applied to a surface of the tub structure. Further, the tub structure can include a BMC to provide a communication interface between the capacitive circuit of the tub structure and the computing device 514. This can provide redundancy to the primary detection circuit found in the PCA and/or server device to reduce false positives and/or false negatives.

Figure 6:
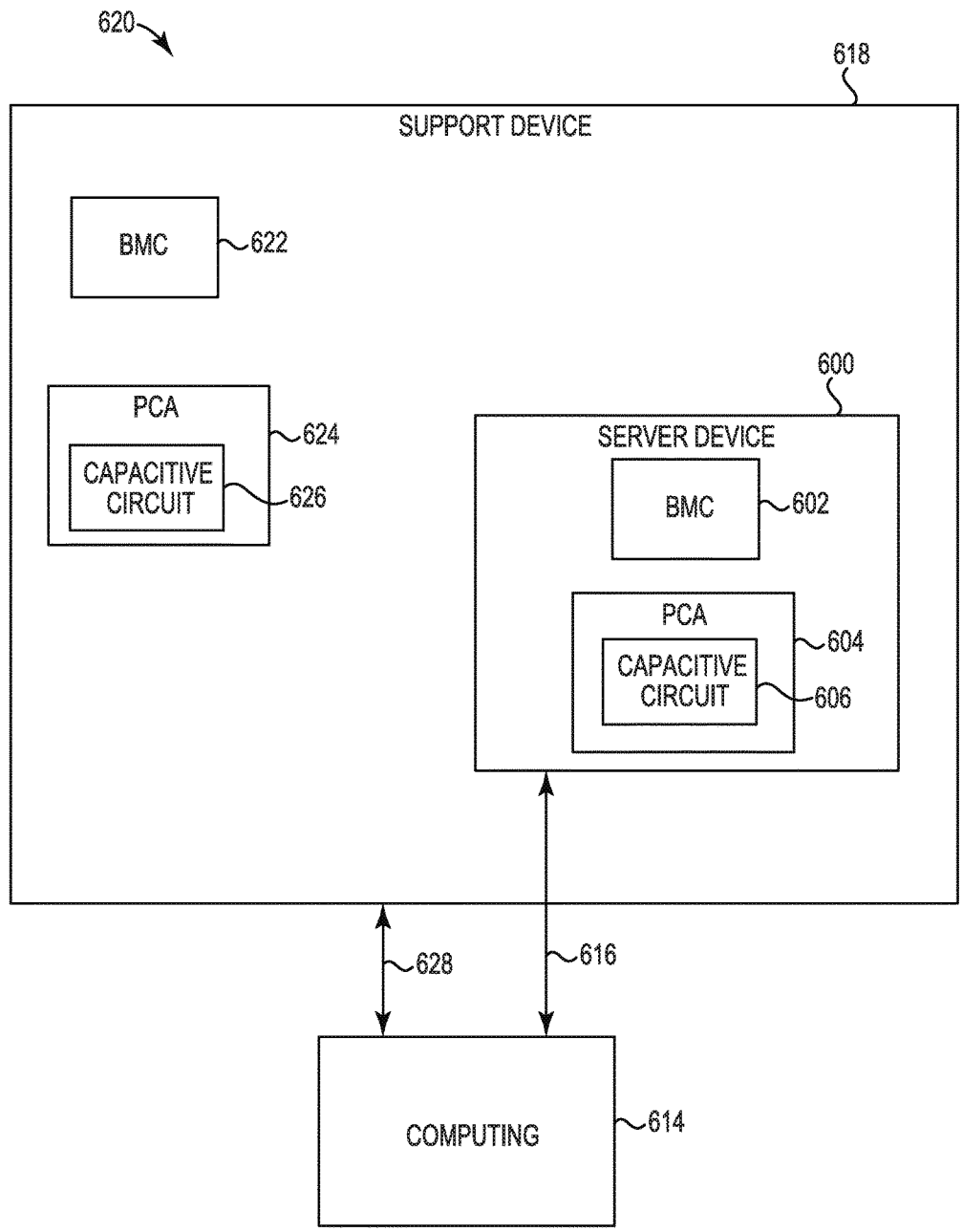
FIG. 6 illustrates a diagram of an example of a server system according to the present disclosure.

FIG. 6 illustrates a diagram of an example of a server system 620 according to the present disclosure. The server system 620, illustrated by FIG. 6, can include a support device 618 to provide support for a plurality of server devices. Examples support devices can include a rack, a chassis, and/or a liquid cooling assembly.

The support device 618 can include a first capacitive circuit 626 located on a PCA 624 of the support device 618 and a first BMC 622. The first BMC 622 can provide a communication interface between the first capacitive circuit 626 and a computing device 614.

A rack, as used herein, is a framework (e.g., a metal framework) designed to support a plurality of rack servers and/or chassis. The rack can contain multiple mounting slots, called bays, each designed to hold equipment secured in place with fasteners. A single rack can contain a plurality of rack servers and/or chassis stacked one above the other, consolidating network resources and flow space. The rack servers can be mounted in the rack horizontally and/or vertically.

The capacitive circuit 626 can be located on a shelf of the rack. A shelf of the rack, as used herein, include a support for a server device (e.g., for a server device to rest on. Alternatively, server devices can be mounted to the rack using fasteners (e.g., screws). The server devices can be oriented in the rack either horizontally or vertically.

A chassis, as previous discussed, is an enclosure which can include multiple blade servers and provide services such as power, cooling, networking, and various interconnects and management. A blade server can be oriented in the chassis horizontally or vertical.

In some examples, the support device 618 can include a chassis and the server system 620 can further include a rack to provide support for the chassis. For example, the rack can include a third capacitive circuit located on a PCA of the rack and a third BMC to provide a communication interface between the third capacitive circuit and the computing device 614.

Further, a liquid cooling assembly can include a plurality of thermal bus bars. A liquid cooling assembly and thermal bus bars are further discussed herein with regards to FIG. 9.

The server system 620 can further include a server device 600. The server device 600 can include a second capacitive circuit 606 located on a PCA 604 of the server device 600 and a second BMC 602. The second BMC 602 can provide a communication interface between the second capacitive circuit 606 and a computing device 614.

The computing device 614 can receive a signal from at least one of the first BMC 622 and the second BMC 602 indicating a detection of liquid. The computing device 614 can identify a location of at least one of the support device 618 and the server device 600 in the server system 620 using a unique ID in the signal.

The computing device 614 can be coupled to the server device 600 via a signal control line 616. The signal control line 616 can communicate signals between the second BMC 602 and the computing device 614. Similarly, the computing device 614 can be coupled to the support device 618 via a signal control line 628. The signal control line 628 can communicate signals between the first BMC 622 and the computing device 614.

As an example, in response to a voltage change measured on the second capacitive circuit 606, a signal from the second capacitive circuit 606 to the computing device 614 can be received indicating detection of liquid at the server device 600. The computing device 614 can identify the location of the server device 600 using the unique ID of the server device 600 in the signal.

Alternatively and/or in addition, in response to a voltage change measured on the first capacitive circuit 626, a signal from the first capacitive circuit 626 to the computing device 614 can be received Indicating detection of liquid at the support device 618. The computing device 614 can identify the location of the support device 618 using the unique ID of the support device 618 in the signal.

Although FIG. 6 illustrates a single support device and a single server device 600, examples are not so limited. For instance, server systems can include a plurality of server devices and/or a plurality of support devices. The unique ID in the signal can be a unique ID for the respective device that measured a change in voltage.

In some examples, the computing device 614 can receive multiple signals. For example, the computing device 614 can receive a first signal from the second BMC 602 indicating detection of liquid at the server device 600. Further, the computing device 614 can receive a second signal from the first BMC 622 indicating detection of liquid at the support device 618.

The computing device 614 can provide multiple actions depending on which level (e.g., server level, chassis level, blade level, etc.) liquid is detected at. Using the above provided example, the computing device 614 can provide an alert to a user in response to the first signal and can automatically shut-off liquid input to the support device 618 in response to the second signal.

Although the present example illustrates two different levels and two signals, examples in accordance with the present disclosure are not so limited. Examples in accordance with the present disclosure can Include signals from more than two levels and/or multiple signals from server devices at the same level (e.g., three server racks send a signal).

For example, a blade server, a chassis that the blade server is located in, and a rack that the chassis is mounted to can each have capacitive circuitry and a BMC. In response to a signal from the blade server indicating a leak, a first action can be performed. In response to a signal from the chassis, a second action can be performed; and in response to a signal from the rack, a third action can be performed.

The first, second, and/or third action can be the same action (e.g., send an alert), and/or can be different actions. For instance, a first action can include providing an alert to a user, the second action can include shutting of liquid input to the chassis, and the third action can include shutting-off liquid to the rack and/or powering down the entire rack.

Actions performed by the computing device 614, in accordance with the present disclosure, can include sending an alarm to a user, shutting-off liquid input to the server device (or support device), powering down the server device, and/or powering down nearby server devices in the server system. For example, in response to detecting a leak in a first blade server of a chassis, remaining blade servers in the chassis (and/or rack) can be powered down.

Figure 7:
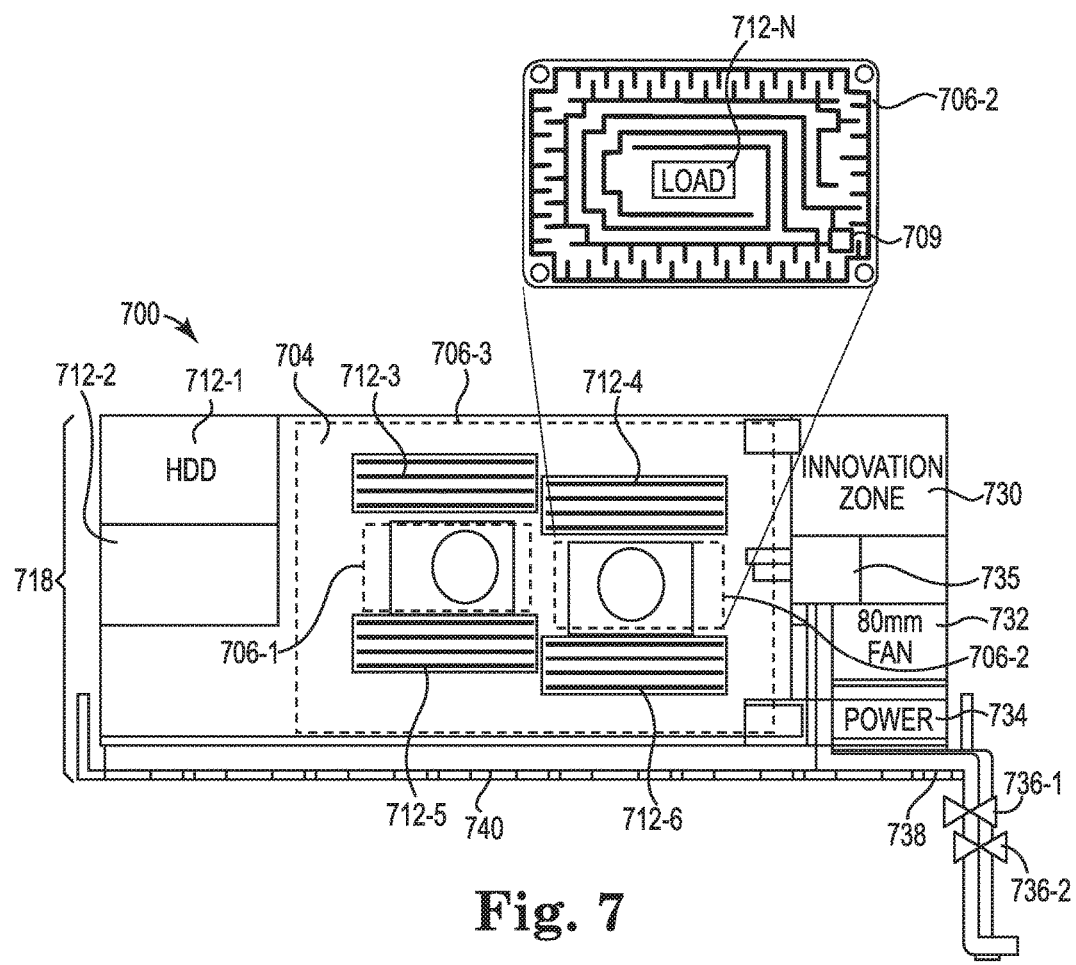
FIG. 7 illustrates a diagram of an examples of a server device with a capacitive circuit according to the present disclosure.

FIG. 7 illustrates a diagram of an example of a server device with a capacitive circuit according to the present disclosure. FIG. 7, for instance, illustrates a chassis 718 for housing blade servers.

FIG. 7 illustrates an example of a blade server 700 in a vertical orientation within the chassis 718 (although examples are not limited to a vertical orientation and blade servers can be in a horizontal orientation as illustrated by FIG. 4A). Internal to the blade server 700 can include a PCA 704 (e.g., a motherboard of the blade server 700) that may include a plurality of loads 712-1, 712-2, 712-3, 712-4, 712-5, 712-6, 712-N (herein generally referred to as the loads 712). The loads 712 can include items such as a central processing unit (CPU), graphic processing unit (GPU), memory, voltage regulate, and other electronic devices (e.g., I/O infrastructure, server trays, etc.).

The loads 712 can share a power source 734, a fan 732, I/O infrastructure, and/or cooling (e.g., innovation zone 730 and water manifold 735). For example, the loads 712 can share a PCA with a capacitive circuit 706-1 and/or a BMC. Alternatively, the loads 712 can share multiple PCAs with capacitive circuits 706-1, 706-2, 706-3 and/or multiple BMCs.

The capacitive circuits 706-1, 706-2, 706-3, as illustrated by FIG. 7, can include an integrated network of traces. That is, the capacitive circuits 706-1, 706-2, 706-3 can be located in a number of locations of the blade server 700. Further, the capacitive circuits 706-1, 706-2, 706-3 can be integrated directly onto the PCA 704 (e.g., the motherboard) of the blade server 700 and/or the chassis 718 (physically and electrically).

Alternatively and/or in addition, the capacitive circuit can be a separate flexible printed circuit board (PCB). Locating the separate flexible PCB on a PCA of a server device can include locating the separate flexible printed circuit board under the PCA and/or on top of the main system PCA. For example, the separate flexible PCB can be shaped (e.g., holes, cuts, etc.) to lie on top of the main system PCA. Further, in some example, the separate flexible PCA can be applied to a sheet metal chassis top cover. In some instances, a chassis housing a blade server may be installed upside down, such that the separate flexible PCA applied to the sheet metal chassis top cover can detect the presence of liquid.

Further, as illustrated by FIG. 7, at least a portion of the loads 712 can include a capacitive circuit. For example, a particular capacitive circuit 706-2 can be located around a load 712-N of the blade server 700. The particular capacitive circuit 706-2 can include a leak detection logic device 309 to identify and report a leak. The leak detection logic device 309 can connect to the PCA 704 of the blade server 700.

The chassis 718 can include a tub structure 740. The tub structure 740 can include a capacitive circuit and in the event of a leak, the tub structure 740 can contain liquid from the leak, send an alert to the BMC, and can drain 738 liquid away safely.

The tub structure 740, as previously discussed, can include an enclosure that is underneath the chassis 718 and/or other server device to contain liquid from a leak. Such a tub structure can include a drain pan. For example, the tub structure 740 can be a lower height than the height of the chassis 718 (or rack server). A drain 738 can be located in the tub structure 740 to allow for draining of liquid from the tub structure 740. A similar tub structure can be underneath a rack server, for example.

In response to a detected leak, an alert can be sent to a user and/or liquid input to the blade server 700 can be shut-off by the user. Alternatively, liquid input to the blade server 700 can be automatically shut-off in response to the detected leak. For example, each chassis in a rack and/or a server system can include a valve 736-1, 736-2. The valve can be turned off to shut-off liquid input to the respective blade server.

For example, a leak may be detected at a blade server 700 in the chassis 718. The capacitive circuits 706-1, 706-2, 706-3 can be used to detect a source of the leak while the tub structure 740 can protect other hardware in the rack. Further, as illustrated by FIG. 7, valves 736-1, 736-2 can be used to isolate the blade server 700 from the rest of the rack.

Figure 8:
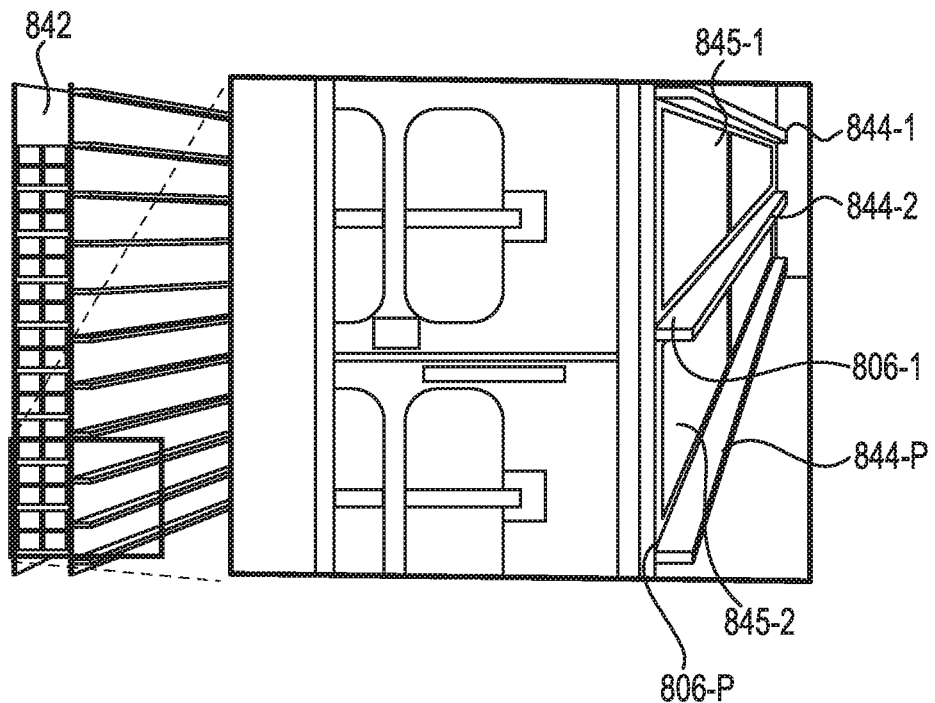
FIGS. 8-9 illustrate diagrams of examples of server devices with a capacitive circuit according to the present disclosure.
Figure 9:
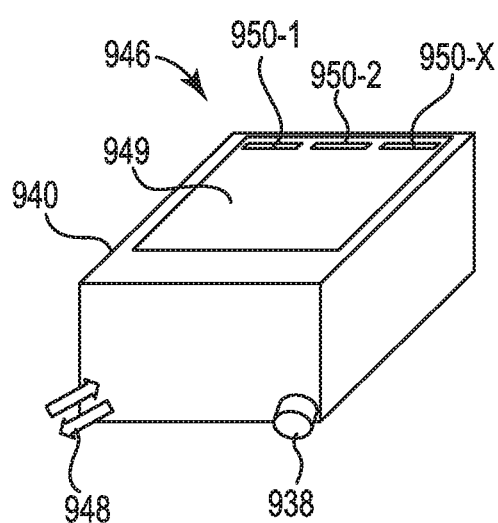

FIGS. 8-9 illustrate diagrams of examples of server devices with a capacitive circuit according to the present disclosure.

FIG. 8 illustrates an example server device that includes a liquid cooling assembly 842. A liquid cooling assembly 842 can include a wall structure (e.g., a rack) with a plurality of thermal bus bars 845-1, 845-2 thereon. A thermal bus bar can include a structure formed to include thermally conductive materials that when placed in contact with another thermally conductive material, the thermal bus bar receives heat therefrom.

For example, a thermal bus bar can include a rectangular part that is filled with a number of fluid channels that allow cooling fluid to be pumped from a cooling base. A cooling base can include an enclosure that holds piping, pumps, and/or heat exchangers for the thermal bus bars. Heat from the server devices can transfer to the liquid cooling assembly 842 via a dry disconnect. The cooling components (e.g., thermal bus bars, cooling base, and/or other cooling components) are outside of the server devices to enable the liquid cooling to occur away from the server devices.

As illustrated by the exploded view of the liquid cooling assembly 842, the liquid cooling assembly 842 can include a plurality of shelves 844-1, 844-2, 844-P. The thermal bus bars 845-1, 845-2 can be located between shelves 844-1, 844-2, 844-P of the liquid cooling assembly 842.

In some examples, a capacitive circuit 806-1, 806-P can be located on the shelves 844-1, 844-2, 844-P of the liquid cooling assembly 842 and underneath the thermal bus bars 845-1, 845-2. A liquid leak caused by one of the thermal bus bars 845-1, 845-2 can be detected using the capacitive circuits 806-1, 806-P underneath the thermal bus bars 845-1, 845-2.

FIG. 9 illustrates a server device that includes a server cartridge system 946. An example server cartridge system 946 can include a top-access cartridge system.

A server cartridge system 946 can include a chassis 949 and a plurality of server devices 950-1, 950-2, 950-X that can be installed and/or removed from the chassis 949. The server devices 950-1, 950-2, 950-X can be removable cartridges.

A removable cartridge, as used herein, can include a frame (e.g., a case) substantially surrounding a processor, a memory, and/or a non-volatile storage device coupled to the processor. Removable cartridges can be, in various examples, hot-plugged. Each removable cartridge can be tailored toward carrying out specific computing workloads that can be carried out in parallel. The removable cartridges installed in a chassis can share a number of resources, such as management, power and cooling supplies, and networking.

The server cartridge system 946, as illustrated by FIG. 9, can include a tub structure 940 surrounding the chassis 949 to collect liquid in the event of a leak. For example, a fluid input/output connection 948 at a bulkhead with coiled hoses can allow for extension from the rack and for receiving liquid cooling. In response to a leak, the liquid can be contained within the tub structure 940 and can exit from the drain 938.

Although the tub structure 940 illustrates a height that surrounds the chassis 949, examples are not so limited. For example, the tub structure 940 can include a lower height than the chassis 949.

In the foregoing detailed description of the present disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. In addition, the proportion and the relative scale of the elements provided in the figures are intended to illustrate the examples of the present disclosure, and should not be taken in a limiting sense. Further, as used herein, "a number of" an element and/or feature can refer to one or more of such elements and/or features.

What is claimed:

1. A system, comprising:
   a server device including:
      a printed circuit assembly (PCA) that includes electronic components;
      a capacitive liquid detection circuit that is located on the PCA and surrounds at least one of the electronic components to detect a presence of liquid on the PCA; and
      a baseboard management controller unit (BMC);
   wherein the capacitive liquid detection circuit is to notify the BMC responsive to detecting the presence of liquid, and
   the BCM is to send a signal to a computing device responsive to being notified by the capacitive liquid detection circuit.

2. The system of claim 1,
   wherein the capacitive liquid detection circuit includes capacitive elements and leak detection logic that detects the presence of liquid by detecting a change in a voltage across the capacitive elements.

3. The system of claim 1,
   wherein the capacitive liquid detection circuit is integrated into the PCA.

4. The system of claim 3,
   wherein the at least one of the electronic components that is surrounded by the capacitive elements includes a processor.

5. The system of claim 3,
   wherein the at least one of the electronic components that is surrounded by the capacitive elements includes a memory.

6. The system of claim 4,
   wherein the server device includes a tub structure to collect liquid that is leaked in the server device.

7. The system of claim 6,
   wherein the server device includes a second capacitive liquid detection circuit in the tub structure to detect a presence of liquid in the tub structure and notify the BMC responsive to detecting the presence of liquid.

8. The system of claim 7,
   wherein the server device is capable of being installed in a support structure that is to house multiple server devices, and
   the tub structure is arranged so as to be below the PCA when the server device is installed in the support structure.

9. The system of claim 8, further comprising
   the support structure, and
   a second tub structure arranged in the support structure to collect liquid that is leaked in the support structure.

10. The system of claim 9, further comprising:
    a third capacitive liquid detection circuit in the second tub structure to detect a presence of liquid in the second tub structure.

11. The system of claim 10, further comprising:
    the computing device, wherein the computing device is programmed to, responsive to receiving the signal from the BMC of the server device, generate an alert, shut off supply of liquid to the server device, or both.

12. The system of claim 11,
    wherein the signal sent from the BCM of the server to the computing device includes an identifier of the server device.

13. The system of claim 1,
    wherein the capacitive liquid detection circuit is part of a printed circuit board (PCB) that is separate from the PCA, the PCB being disposed on the PCA.

14. The system of claim 13,
    wherein the PCB is flexible and is shaped to surround multiple of the electronic components of the PCA when the PCB is disposed on the PCA.

15. The system of claim 1,
    wherein the capacitive liquid detection circuit is integrated into the PCA.

16. The system of claim 1,
    wherein the capacitive liquid detection circuit is part of a printed circuit board (PCB) that is separate from the PCA, the PCB being disposed on the PCA.

17. The system of claim 1, further comprising:
    a support structure to support multiple server devices including the server device;
    a tub structure to collected liquid leaked in the support structure.

18. The system of claim 17,
    wherein the support structure includes a cartridge server chassis and the server devices include cartridge servers, and
    the tub structure surrounds at least a bottom of the cartridge server chassis to collect liquid leaked into the cartridge server chassis.

19. The system of claim 17,
wherein the support structure includes a liquid cooled thermal bus bar to cool the server devices, and
the tub structure is arranged to collect liquid leaked from the thermal bus bar.

* * * * *